(12) United States Patent
Shearon et al.

(10) Patent No.: US 6,727,745 B2
(45) Date of Patent: Apr. 27, 2004

(54) INTEGRATED CIRCUIT WITH CURRENT SENSE CIRCUIT AND ASSOCIATED METHODS

(75) Inventors: William Shearon, Findlay, OH (US); Salomon Vulih, Neshanic Station, NJ (US); Donald Preslar, Somerville, NJ (US)

(73) Assignee: Intersil Americas Inc., Milpitis, CA (US)

( * ) Notice: Subject to any disclaimer, the term of this patent is extended or adjusted under 35 U.S.C. 154(b) by 44 days.

(21) Appl. No.: 09/928,821

(22) Filed: Aug. 13, 2001

(65) Prior Publication Data

US 2002/0024786 A1 Feb. 28, 2002

Related U.S. Application Data

(60) Provisional application No. 60/227,551, filed on Aug. 23, 2000.

(51) Int. Cl.[7] .................................................. G05F 1/10
(52) U.S. Cl. ........................ 327/541; 327/540; 323/315
(58) Field of Search ................................. 327/538, 539, 327/540, 541, 543, 427; 323/312, 313, 316

(56) References Cited

U.S. PATENT DOCUMENTS

| 5,159,516 | A | | 10/1992 | Fujihira | 361/18 |
|---|---|---|---|---|---|
| 5,867,014 | A | | 2/1999 | Wrathall et al. | 323/316 |
| 5,877,617 | A | | 3/1999 | Ueda | 323/316 |
| 6,011,413 | A | | 1/2000 | Hayakawa et al. | 327/51 |
| 6,150,872 | A | * | 11/2000 | McNeill et al. | 327/539 |
| 6,281,743 | B1 | * | 8/2001 | Doyle | 327/539 |
| 6,362,612 | B1 | * | 3/2002 | Harris | 323/312 |
| 6,381,491 | B1 | * | 4/2002 | Maile et al. | 607/2 |
| 6,407,622 | B1 | * | 6/2002 | Opris | 327/539 |
| 6,489,835 | B1 | * | 12/2002 | Yu et al. | 327/539 |
| 6,529,066 | B1 | * | 3/2003 | Guenot et al. | 327/539 |

FOREIGN PATENT DOCUMENTS

EP 0 814 395 12/1997 ............ G05F/1/575

* cited by examiner

*Primary Examiner*—Terry D. Cunningham
(74) *Attorney, Agent, or Firm*—Allen, Dyer, Doppelt, Milbrath & Gilchrist, P.A.

(57) ABSTRACT

The integrated circuit includes a power driving device, and a pilot device for sensing current through the power driving device. The pilot device includes a composite pilot having a plurality of series connected transistors and which is at least active while the power driving device is in a linear mode, and a secondary pilot which is active while the power driving device is in a saturation mode. Also, a control circuit activates the secondary pilot.

21 Claims, 2 Drawing Sheets

US 6,727,745 B2

INTEGRATED CIRCUIT WITH CURRENT SENSE CIRCUIT AND ASSOCIATED METHODS

RELATED APPLICATION

This application is based upon prior filed copending provisional application No. 60/227,551 filed Aug. 23, 2000, the entire disclosure of which is incorporated herein by reference.

FIELD OF THE INVENTION

The present invention relates to integrated circuits, and more particularly, to a pilot-sensor style power output of an integrated circuit.

BACKGROUND OF THE INVENTION

Often, a high-power output from an integrated circuit (IC) must have a fail-safe current limiting function built-in to the device to prevent damage either to the IC or the load which it must drive. There are two conventional methods to sense the current through the IC driver output. The simpler method uses an explicit or parasitic resistance in the current path. This resistance, which must be predictable, causes a voltage drop which can be compared to a reference voltage. This voltage drop across the sense resistance is usually undesirable because it reduces the output voltage swing and generates on-chip power waste.

The second method introduces no series voltage drop in the output path, but instead builds a parallel, sense field effect transistor (FET), also known as a pilot device, which runs at a known reference current level. This pilot device is matched exactly to the driver (i.e. the power FET), except the pilot device is scaled down significantly in size and in current from the driver. In this way, the pilot and the driver will be running the same current densities at the trip-point for the limiter (the maximum driver current).

U.S. Pat. No. 4,553,084 to Wrathall describes a current sensing circuit with a pilot sense transistor having a sensing resistor in its source leg. The pilot sense transistor is a portion of a large switching transistor and so variations in the large switching transistor can be accurately tracked by the pilot sense transistor. An operational amplifier monitors the signal provided by the sensing resistor for providing feedback information to a driver circuit. Wrathall describes another apparatus for sensing load current in U.S. Pat. No. 4,820,968 which uses a sense resistor in the leg of a current mirroring transistor to convert a mirrored current into a voltage. This voltage is then compared to a reference voltage generated by a reference current which is a equal to a portion of the load current.

The drawbacks to the pilot sensor method are that the pilot reference current is waste-current, and that the scaled-match from pilot to driver becomes more difficult and improbable if the ratio is very large (e.g. 50,000:1). There is, in fact, a trade-off between the waste-current used and increasingly large size ratio. If the IC is to have low power dissipation and accepts the very large ratio of sizes between the pilot and driver FETS, either the current limiter tolerances must be made very loose in the specification, or the part will have to be trimmed to compensate for the inaccuracies of fabrication. Trimming the part adds cost to the part due to increased test time and chip area consumed by the trim circuit.

SUMMARY OF THE INVENTION

In view of the foregoing background, it is therefore an object of the invention to provide a circuit and associated method for sensing current in a power output of an integrated circuit with low power dissipation, reduced need to trim the circuit, and reduced sensitivity to variations in fabrication.

This and other objects, features and advantages in accordance with the present invention are provided by an integrated circuit including a power driving device, and a pilot device for sensing current through the power driving device. The pilot device includes a composite pilot having a plurality of series connected transistors operative at least while the power driving device is in a linear mode, and a secondary pilot operative while the power driving device is operating in a saturation mode. Also, a control circuit activates the secondary pilot.

Preferably, the power driving device comprises a power field effect transistor (FET), and the composite pilot and the secondary pilot comprise sense FETs scaled and matched to the power FET. The pilot device generates a reference voltage and an amplifier may compare the reference voltage with a source voltage of the power FET. Such an amplifier controls gate voltages of the power FET and the sense FETs.

The pilot device also includes a first current source connected to the composite pilot, and a second current source connected to the secondary pilot. The control circuit controls the second current source to activate the secondary pilot. The control circuit may comprise an over-current detector for detecting whether the power driving device is operating in the saturation mode. Furthermore, the composite pilot may comprise at least twenty series connected sense FETs.

Objects, features and advantages in accordance with the present invention are also provided by a method of regulating current in an integrated circuit including a power driving device. The method includes sensing current through the power driving device and generating a reference voltage with a first pilot at least while the power driving device is in a linear mode, detecting whether the power driving device is in a saturation mode, and sensing current through the power driving device and generating the reference voltage with a second pilot while the power driving device is in the saturation mode. The method may also include comparing the reference voltage with a source voltage of the power FET and controlling gate voltages of the power FET and the sense FETs based upon the comparison of the reference voltage with the source voltage of the power FET.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
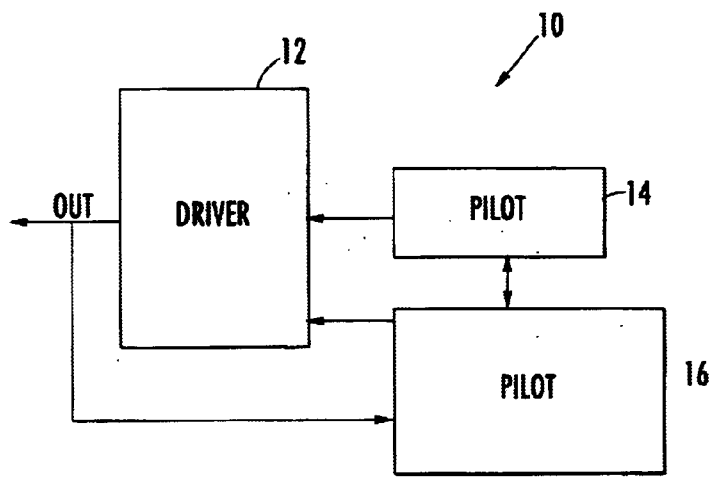
FIG. 1 is a schematic block diagram of an integrated circuit according to the present invention.

Referring to FIG. 1, an integrated circuit (IC) 10 in accordance with the present invention will now be described. The IC 10 may be the output stage for a high side driver (NFET) hot-plug product disclosed in the copending provisional application No. 60/227,551 filed Aug. 23, 2000 and/or for the dual power supply controller ISL6118 disclosed in the corresponding Data Sheet published May 2001, and each of which is manufactured by Intersil Inc. of Palm Bay, Fla., the entire disclosures of which are incorporated herein by reference. The IC 10 includes a driver 12 providing a high power output that requires a current limiting function built in to the device to prevent damage to either the IC or the load which it drives.

Accordingly, the IC 10 includes a pilot device 14 which is a scaled down version of the driver 12, as would be appreciated by the skilled artisan. The pilot device 14 is scaled down significantly in size and in current but is matched exactly to the driver 12. The pilot runs a known amount of current and develops a reference voltage which is compared to the output voltage of the larger driver 12. The IC 10 also includes a controller 16 for performing the comparison and controlling the pilot device 14 and driver 12.

To minimize waste current through the pilot device 14, a very small device must be used. For example, the pilot device 14 to driver 12 ratio may be 50,000:1 for a circuit using a 50,000:1 ratio of currents. At such a large ratio, conventional pilot device performance would typically become unmatched from the large driver and require trimming and/or loose data sheet tolerances. The pilot would be so narrow that it could have a 20% error from fabrication variations. Increasing the size of the pilot device increases the waste current, but the effect of the variation is less prominent.

However, with reference to FIG. 2, an embodiment of the IC 10 including a pilot device 14 with low power dissipation, reduced need for trimming, and reduced sensitivity to variations in fabrication will now be described. In this embodiment, the IC 10 includes a power field effect transistor (FET) D as the driver 12. For example, the power FET D may have a width of 100,000 microns. The pilot device 14 is a composite pilot and has a plurality of sense FETs P1-Pn, e.g. twenty, connected in series and connected to current sink 24. Each sense FET P1-Pn has a relatively large width, e.g. 40 microns, but with the plurality connected in series, a larger voltage drop is developed and the error is effectively diminished by a factor of n, e.g. twenty, while running the same amount of waste current. An amplifier/comparator 26 compares the reference voltage from the composite pilot device 14 with the source voltage from the power FET D of the driver 12, while providing gate voltage signals to the sense FETs P1-Pn and power FET. An over current detector 28 is also provided as part of the control circuit 16.

Figure 2:
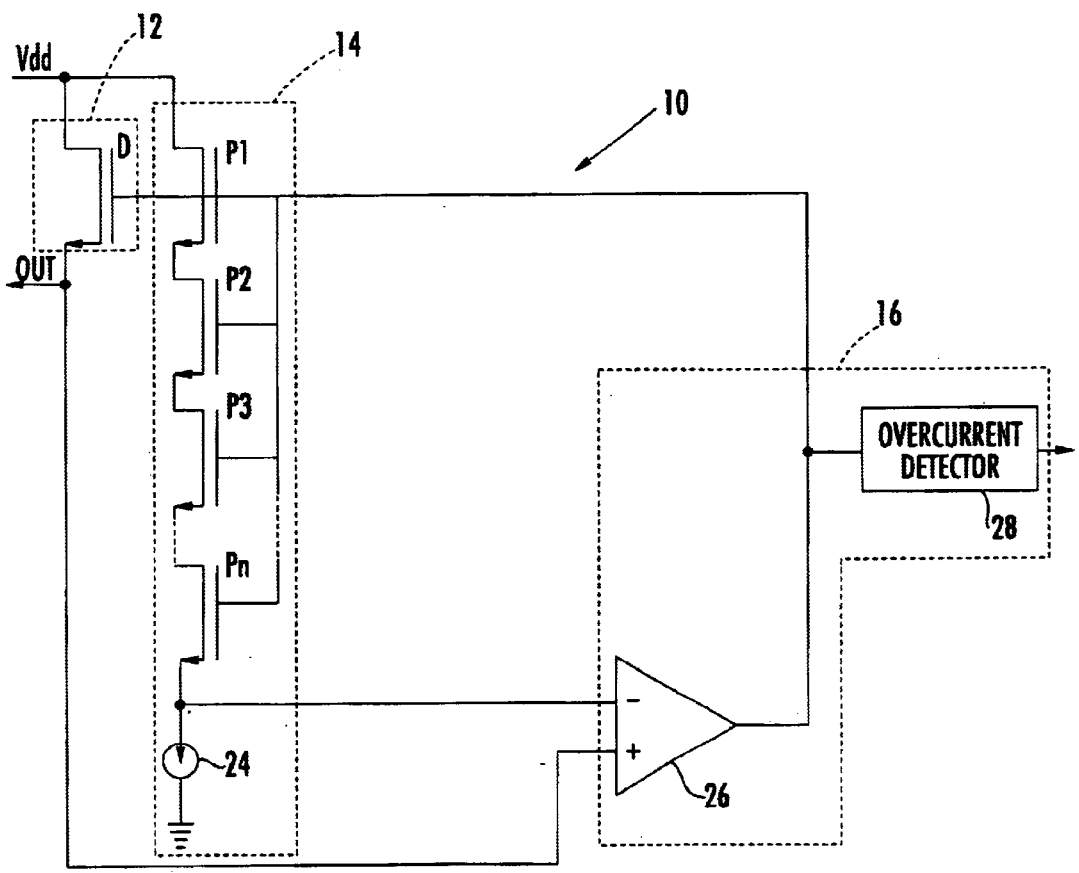
FIG. 2 is a schematic diagram illustrating an embodiment of the integrated circuit of FIG. 1.

However, the composite pilot device 14 of the embodiment described with respect to FIG. 2 does have a drawback. Such a composite pilot device 14 operates well when the driver 12 is operating in a linear mode of operation, i.e. under normal operation. When the driver 12 goes into the saturation region of operation, i.e. during overcurrent, the error increases.

Figure 3:
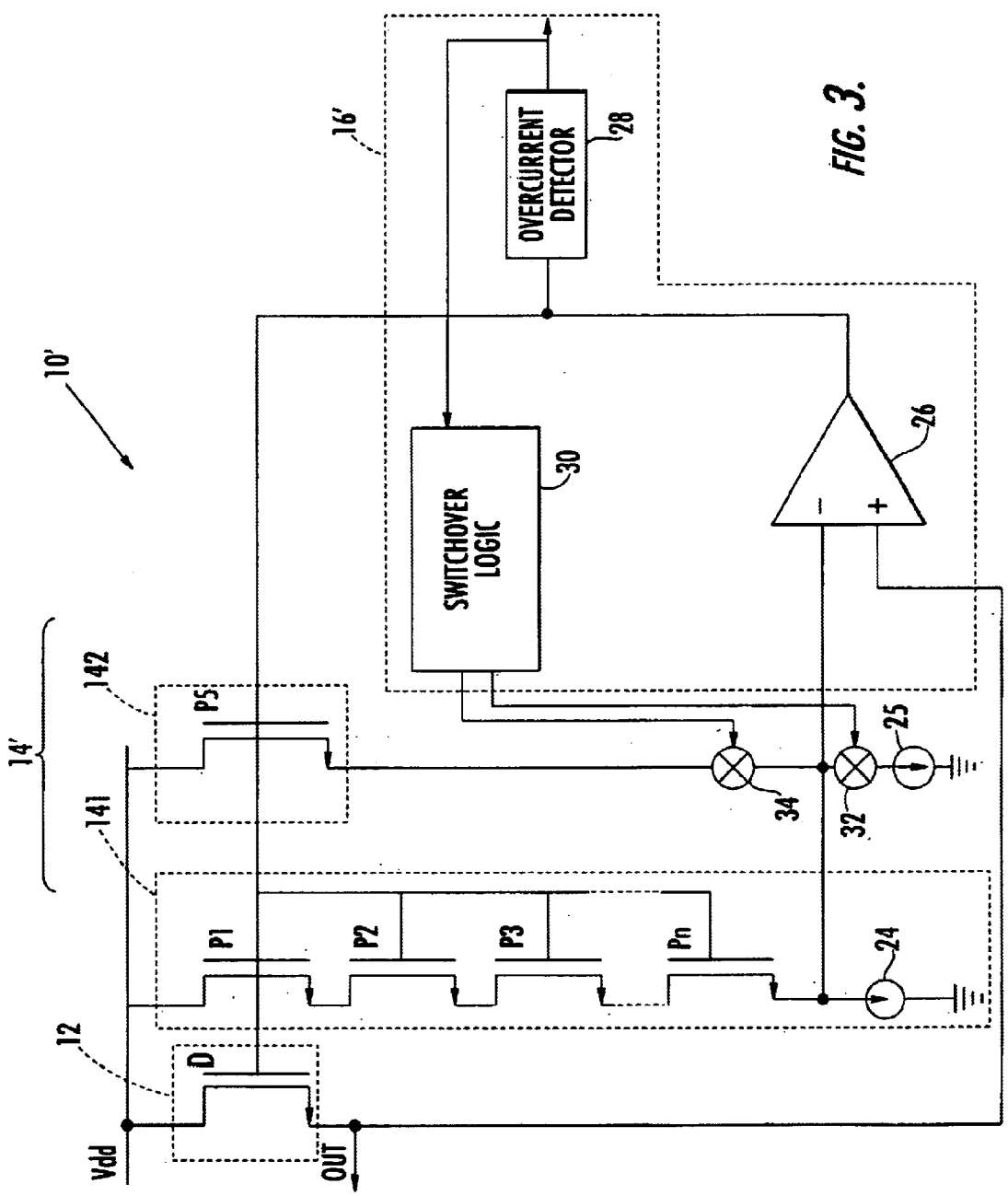
FIG. 3 is a schematic diagram illustrating another embodiment of the integrated circuit of FIG. 1.

Therefore, another embodiment of the IC 10' including a pilot device 14' with low power dissipation, reduced need for trimming, reduced sensitivity to variations in fabrication, and improved flatness of regulation during saturation will now be described with reference to FIG. 3. Again, the IC 10' includes a power FET D as the driver 12 and a composite pilot device 141 having a plurality of sense FETs P1-Pn, connected in series as described with reference to the first embodiment.

However, the pilot device 14' also includes a secondary pilot device 142 comprising a sense FET PS which is relatively large, e.g. the same size as each of the sense FETs P1-Pn, and has a higher waste current. The secondary pilot device 142 is switched in and biased up only when the accuracy of the composite pilot device 141 is compromised. The sense FET PS is more accurate and the large waste current from the reference is turned off when the driver 12 is operating in the linear mode. In this case, the only time the sense FET PS is switched on is when the driver is outputting its maximum current (e.g. 500–600 mA). The reference current is only about 0.04% of such an output current and results in an insignificant waste during saturation or over current operation.

As described and shown here, the composite pilot device 141 is always active, even in saturation mode. In other words, the composite pilot device 141 is not switched off during overcurrent. However, it is also possible to design the circuit so that the composite pilot device 141 and the secondary pilot device 142 operate in the alternative. Such an approach would involve some hysteresis to avoid any glitch as would be appreciated by those skilled in the art.

In this embodiment, the control circuit 16' includes an amplifier/comparator 26 for comparing the reference voltage from the dual pilot device 14' with the source voltage from the power FET D of the driver 12, while providing gate voltage signals to the sense FETs P1-Pn, PS and power FET D. An over current detector 28 is also provided for at least providing control signals to switches 32 and 34 to switch in and bias up the secondary pilot PS via current sink 25. Thus, a pilot device 14' with low power dissipation, reduced need for trimming, reduced sensitivity to variations in fabrication, and improved flatness of regulation during saturation has been described and shown.

The ICs 10 and 10' have been shown and described in relation to an NFET high side driver/limiter; however, the invention is also applicable to a PFET low-side driver/limiter which would be complementary to the one shown. Of course, there are other equivalent ways to provide the switching between the pilots.

A method aspect of the invention includes regulating current in an integrated circuit 10 having a power driving device 12. The method includes sensing current through the power driving device 12 and generating a reference voltage with a first pilot 141 at least while the power driving device is in a linear mode, detecting whether the power driving device is in a saturation mode, and sensing current through the power driving device and generating the reference voltage with a second pilot 142 while the power driving device is in the saturation mode. The method may also include comparing the reference voltage with a source voltage of the power FET D and controlling gate voltages of the power FET and the sense FETs P1-Pn, PS based upon the comparison of the reference voltage with the source voltage of the power FET.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. An integrated circuit comprising:
   a power driving device having a control terminal, and having a current flow path therethrough coupled between a first voltage terminal and an output terminal;
   a pilot circuit for sensing current through said power driving device and comprising
      a composite pilot circuit including a plurality of transistors having control terminals, and current flow paths therethrough connected in series between said first voltage terminal and a second voltage terminal, and
      a secondary pilot transistor having a control terminal, and having a current flow path therethrough coupled between first voltage terminal and said second voltage terminal; and
      a control circuit, coupled to the control terminal of said power driving device, to control terminals of said plurality of transistors, and to the control terminal of said secondary pilot transistor, and being operative to render said power driving device operative, and being also operative to render said plurality of transistors of said composite pilot circuit operative while said power driving device is in a linear mode of operation, and to render said secondary pilot transistor operative while said power driving device is in a saturation mode of operation.

2. An integrated circuit according to claim 1 wherein the power driving device comprises a power field effect transistor (FET); and wherein the composite pilot circuit and the secondary pilot transistor comprise sense FETs scaled and matched to the power FET.

3. An integrated circuit according to claim 2 wherein the pilot device generates a reference voltage; and wherein said control circuit includes an amplifier for comparing the reference voltage with a source voltage of the power FET.

4. An integrated circuit according to claim 3 wherein said control circuit controls gate voltages of the power FET and the sense FETs.

5. An integrated circuit according to claim 1, wherein said composite pilot circuit further includes a first current source coupled in series with the current flow paths through said plurality of transistors, and a second current source connected in series with the current flow path through said secondary pilot transistor, and wherein said control circuit is operative to control said second current source to activate said secondary pilot transistor.

6. An integrated circuit according to claim 1 wherein the control circuit comprises an over-current detector for detecting whether the power driving device is operating in the saturation mode.

7. An integrated circuit according to claim 1 wherein the composite pilot circuit comprises at least twenty series connected sense FETs.

8. An integrated circuit comprising:
   a power driving device having a control terminal, and having a current flow path therethrough coupled between a first voltage terminal and an output terminal;
   a pilot circuit for sensing current through said power driving device and comprising
      a first pilot transistor having a control terminal, and a current flow path therethrough connected between said first voltage terminal and a second voltage terminal, and
      a secondary pilot transistor having a control terminal, and having a current flow path therethrough coupled between first voltage terminal and said second voltage terminal; and
      a control circuit, coupled to control terminals of said power driving device, and said first and secondary pilot transistors, and being operative to render said power driving device operative, and being also operative to render said first pilot transistor operative while said power driving device is in a linear mode of operation, and to render said secondary pilot transistor operative while said power driving device is in a saturation mode of operation.

9. An integrated circuit according to claim 8 wherein the power driving device comprises a power field effect transistor (FET); and wherein the first pilot transistor and the second pilot transistor comprise sense FETs scaled and matched to the power FET.

10. An integrated circuit according to claim 9 wherein the pilot circuit generates a reference voltage; and wherein said control circuit includes an amplifier for comparing the reference voltage with a source voltage of the power FET.

11. An integrated circuit according to claim 10 wherein the control circuit controls gate voltages of the power FET and the sense FETs.

12. An integrated circuit according to claim 8, wherein said pilot circuit further includes a first current source coupled in series with the current flow path through first pilot transistor, and a second current source connected in series with the current flow path through said secondary pilot transistor, and wherein said control circuit is operative to control said second current source to activate said secondary pilot transistor.

13. An integrated circuit according to claim 8 wherein the control circuit comprises an over-current detector for detecting whether the power driving device is operating in the saturation mode.

14. An integrated circuit comprising:
   a power driving field effect transistor (FET) having a gate terminal, and having a drain-source current flow path therethrough coupled between a first voltage terminal and an output terminal;
   a composite pilot circuit including a plurality of series-connected sense field effect transistors (FETs) having gate terminals, and having drain-source current flow paths therethrough connected in series between said first voltage terminal and a second voltage terminal and being operative to sense current flow through said power driving FET and to generate a reference voltage; and
   an amplifier, coupled to compare said reference voltage with a source voltage of said power driving FET, and being coupled to the gate terminal of said power driving FET, and to gate terminals of said plurality of series-connected sense FETs, so as to render said power driving FET operative, and also to render said plurality of series-connected sense FETs transistors of said composite pilot circuit operative.

15. An integrated circuit according to claim 14 wherein the composite pilot circuit further comprises a current source connected to the plurality of series connected sense FETs.

16. An integrated circuit according to claim 14 wherein the composite pilot circuit comprises at least twenty series connected sense FETs.

17. A method of regulating current in an integrated circuit that includes a power driving device having a control terminal, and having a current flow path therethrough coupled between a first voltage terminal and an output terminal, said method comprising the steps of:
   (a) sensing current flow through said power driving device and generating a reference voltage by means of a composite pilot circuit containing a plurality of transistors having control terminals, and current flow paths therethrough connected in series between said first voltage terminal and a second voltage terminal, at least while said power driving device is operating in linear mode;

(b) detecting whether said power driving device is operating in saturation mode; and (c) in response to step (b) detecting that said power driving device is operating in saturation mode, sensing current flow through said power driving device and generating said reference voltage by means of a secondary pilot transistor having a control terminal, and having a current flow path therethrough coupled between first voltage terminal and said second voltage terminal.

18. An integrated circuit according to claim 17, wherein said composite pilot circuit further includes a first current source coupled in series with the current flow paths through said plurality of transistors, and a second current source connected in series with the current flow path through said secondary pilot transistor, and wherein step (c) comprises controlling said second current source to activate said secondary pilot transistor.

19. A method according to claim 17 wherein the power driving device comprises a power field effect transistor (FET); and wherein the composite pilot circuit and the secondary pilot transistor comprise sense FETs scaled and matched to the power FET.

20. A method according to claim 19 further comprising comparing the reference voltage with a source voltage of the power FET.

21. A method according to claim 20 further comprising controlling gate voltages of the power FET and the sense FETs based upon the comparison of the reference voltage with the source voltage of the power FET.

\* \* \* \* \*